(12) United States Patent
Chen et al.

(10) Patent No.: US 10,700,206 B2
(45) Date of Patent: Jun. 30, 2020

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: I-Sheng Chen, Taipei (TW); Chih Chieh Yeh, Taipei (TW); Cheng-Hsien Wu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 25 days.

(21) Appl. No.: 16/207,067

(22) Filed: Nov. 30, 2018

(65) Prior Publication Data
US 2019/0172939 A1 Jun. 6, 2019

Related U.S. Application Data

(63) Continuation of application No. 15/464,484, filed on Mar. 21, 2017, now Pat. No. 10,147,819, which is a (Continued)

(51) Int. Cl.
H01L 29/78 (2006.01)
H01L 29/66 (2006.01)
(Continued)

(52) U.S. Cl.
CPC .... *H01L 29/785* (2013.01); *H01L 21/823821* (2013.01); *H01L 27/0924* (2013.01); (Continued)

(58) Field of Classification Search
None
See application file for complete search history.

(56) References Cited

U.S. PATENT DOCUMENTS 9,236,575 B1 1/2016 Li et al.
9,385,195 B1 7/2016 Zhang
(Continued)

FOREIGN PATENT DOCUMENTS

CN 105336587 A 2/2016
KR 10-2014-0122096 A 10/2014

OTHER PUBLICATIONS

Notice of Allowance issued in U.S. Appl. No. 15/157,139 dated Dec. 7, 2016.
(Continued)

*Primary Examiner* — Michael Lebentritt
(74) *Attorney, Agent, or Firm* — McDermott Will & Emery LLP

(57) ABSTRACT

A semiconductor device includes first channel layers disposed over a substrate, a first source/drain region disposed over the substrate, a gate dielectric layer disposed on each of the first channel layers, a gate electrode layer disposed on the gate dielectric. Each of the first channel layers includes a semiconductor wire made of a first semiconductor material. The semiconductor wire passes through the first source/drain region and enters into an anchor region. At the anchor region, the semiconductor wire has no gate electrode layer and no gate dielectric, and is sandwiched by a second semiconductor material.

20 Claims, 16 Drawing Sheets

Related U.S. Application Data continuation of application No. 15/157,139, filed on May 17, 2016, now Pat. No. 9,627,540.

(60) Provisional application No. 62/261,289, filed on Nov. 30, 2015.

(51) Int. Cl.

| | | |
|---|---|---|
| *H01L 21/8238* | (2006.01) | |
| *H01L 27/092* | (2006.01) | |
| *H01L 29/786* | (2006.01) | |
| *H01L 29/10* | (2006.01) | |
| *H01L 29/417* | (2006.01) | |
| *H01L 29/423* | (2006.01) | |
| *H01L 29/45* | (2006.01) | |

(52) U.S. Cl.
CPC .... *H01L 29/1054* (2013.01); *H01L 29/41791* (2013.01); *H01L 29/42392* (2013.01); *H01L 29/456* (2013.01); *H01L 29/66545* (2013.01); *H01L 29/66795* (2013.01); *H01L 29/7848* (2013.01); *H01L 29/7851* (2013.01); *H01L 29/7853* (2013.01); *H01L 29/78696* (2013.01); *H01L 2029/7858* (2013.01)

(56) References Cited

U.S. PATENT DOCUMENTS

| | | |
|---|---|---|
| 9,502,519 B2 | 11/2016 | Chen et al. |
| 9,502,539 B2 | 11/2016 | Lin et al. |
| 9,627,540 B1 * | 4/2017 | Chen .................. H01L 29/7851 |
| 2007/0145431 A1 | 6/2007 | Kim et al. |
| 2013/0026451 A1 | 1/2013 | Bangsaruntip et al. |
| 2013/0302963 A1 | 11/2013 | Afzali-Ardakani et al. |
| 2015/0041897 A1 | 2/2015 | Basker et al. |
| 2015/0061013 A1 | 3/2015 | Basu et al. |
| 2015/0108573 A1 | 4/2015 | Liu et al. |
| 2015/0236130 A1 | 8/2015 | Huang et al. |
| 2015/0311212 A1 | 10/2015 | Ching et al. |
| 2015/0364563 A1 | 12/2015 | Mieno |
| 2016/0211368 A1 | 7/2016 | Chen et al. |
| 2016/0268375 A1 | 9/2016 | Chen et al. |
| 2016/0322259 A1 | 11/2016 | Cheng et al. |

OTHER PUBLICATIONS

Office Action issued in related U.S. Appl. No. 15/464,484, dated Jan. 18, 2018.

Notice of Allowance issued in related U.S. Appl. No. 15/464,484, dated Jul. 31, 2018.

\* cited by examiner

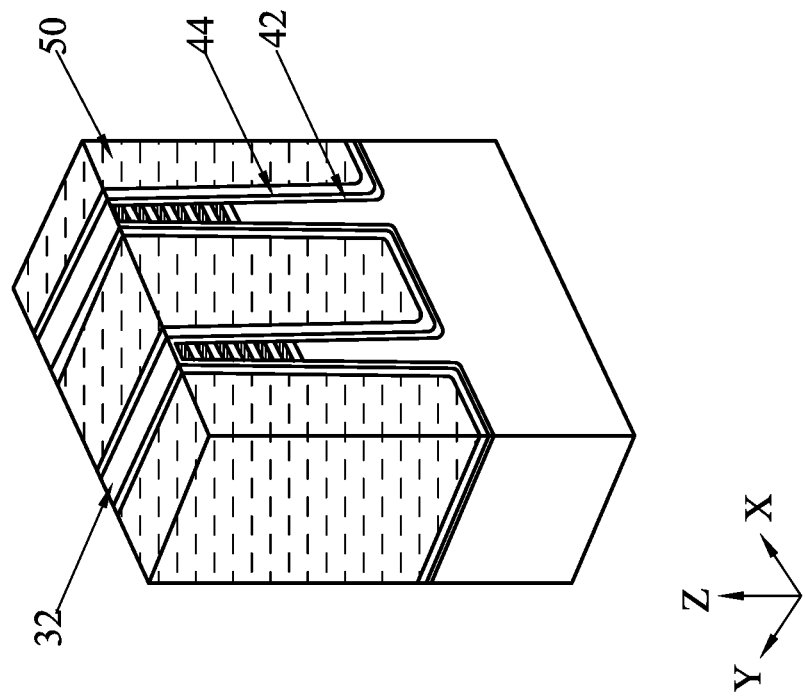
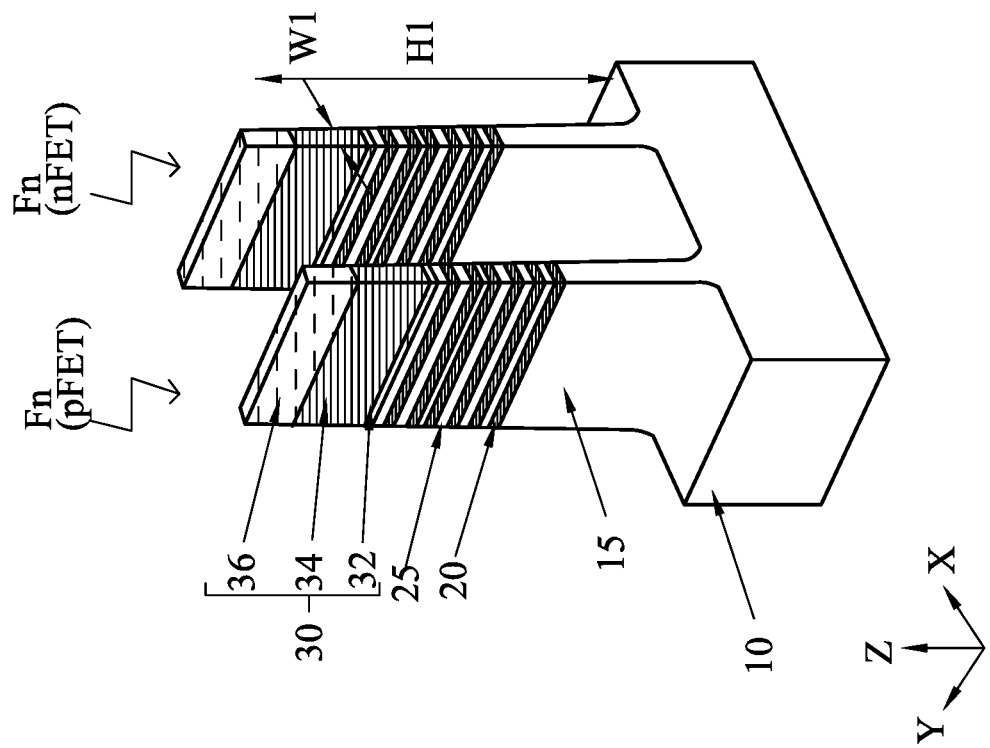
Fig. 3
Fig. 4

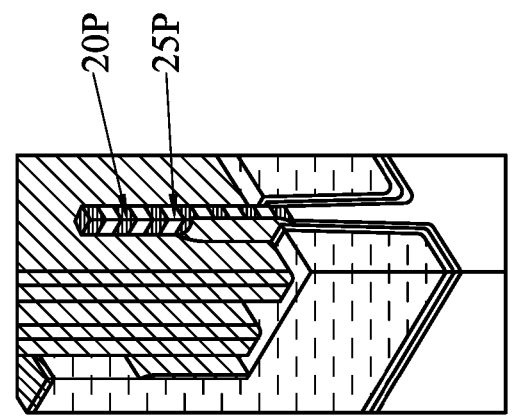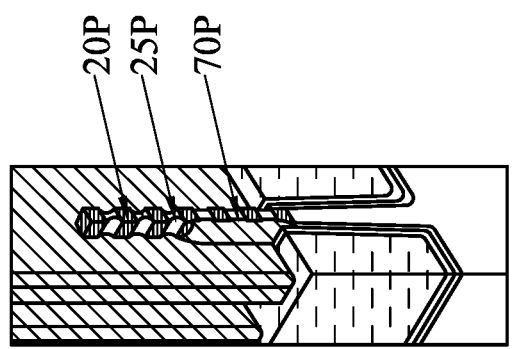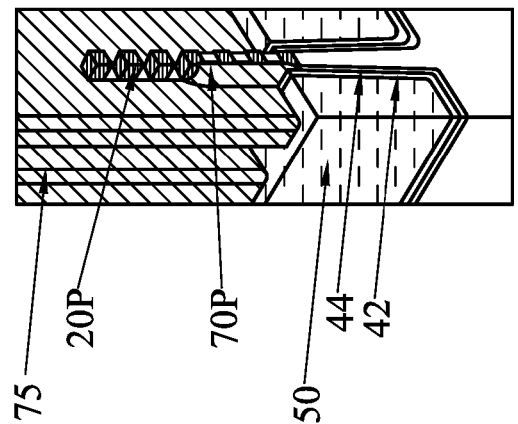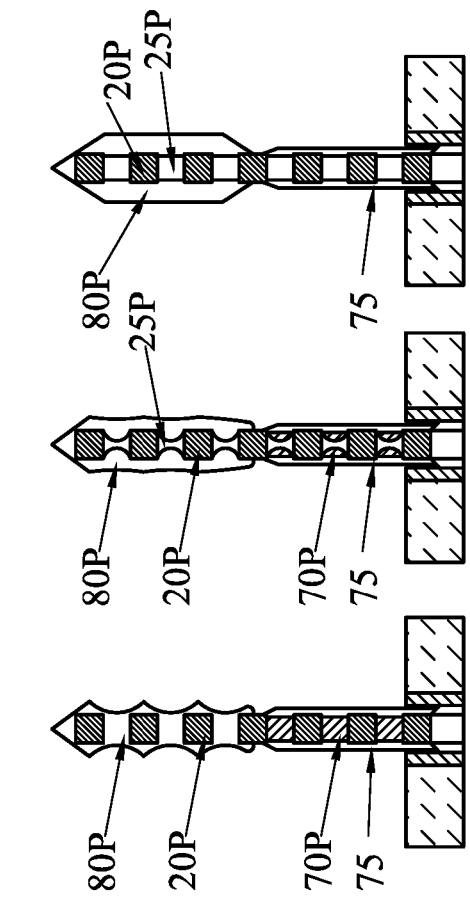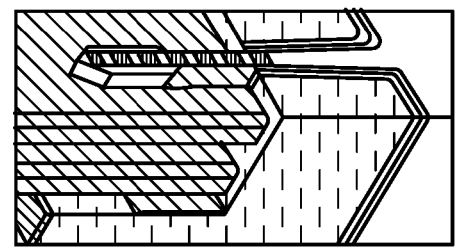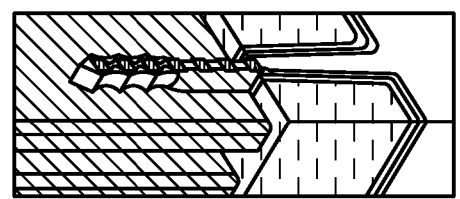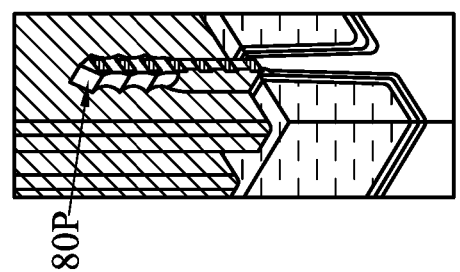

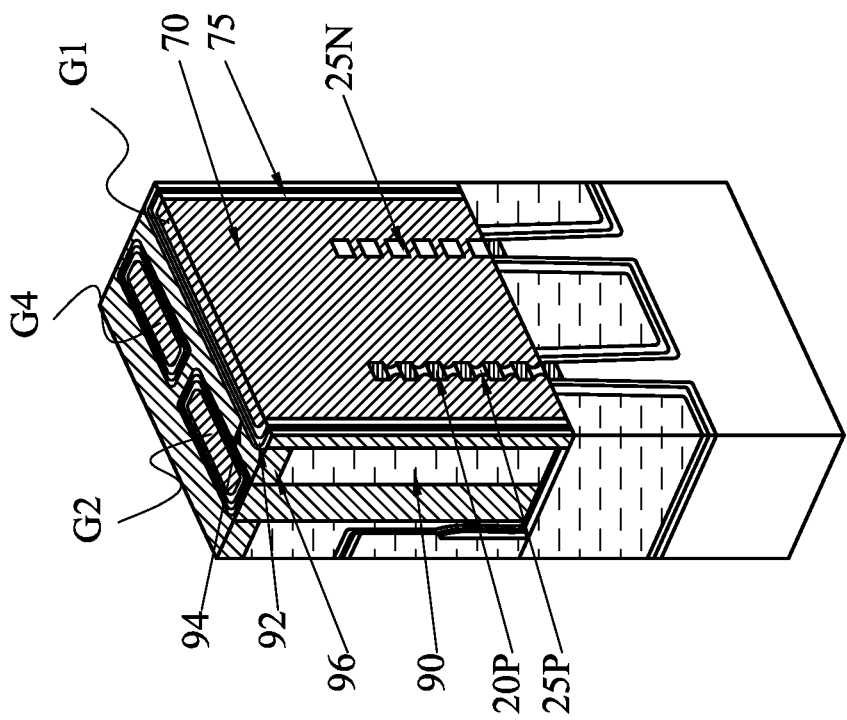
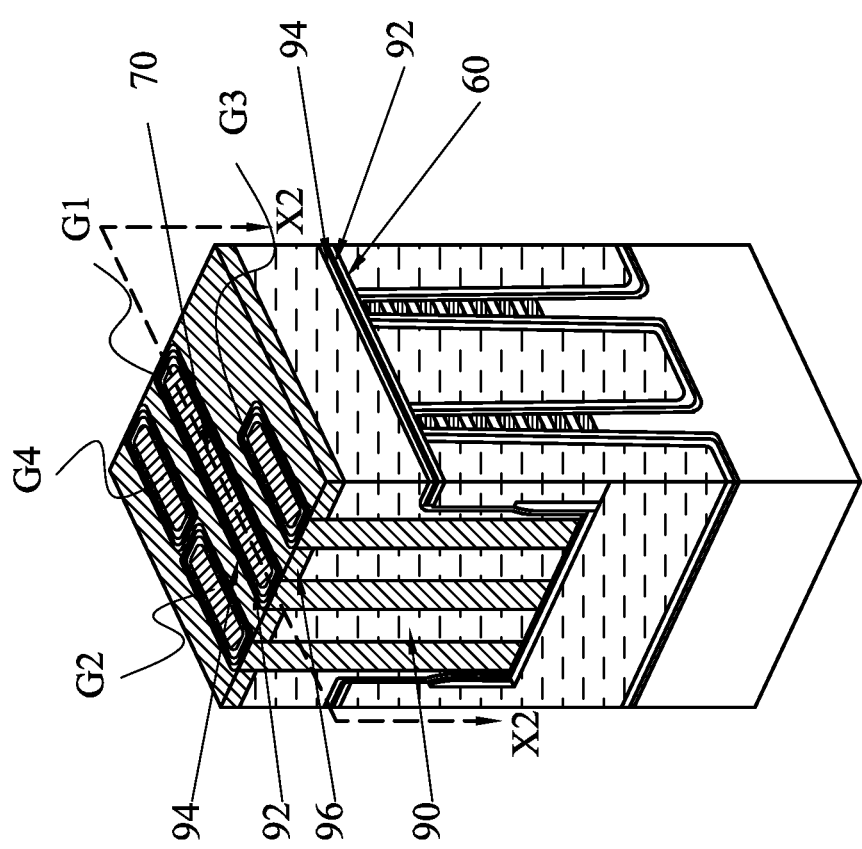
Fig.15A
Fig.15B

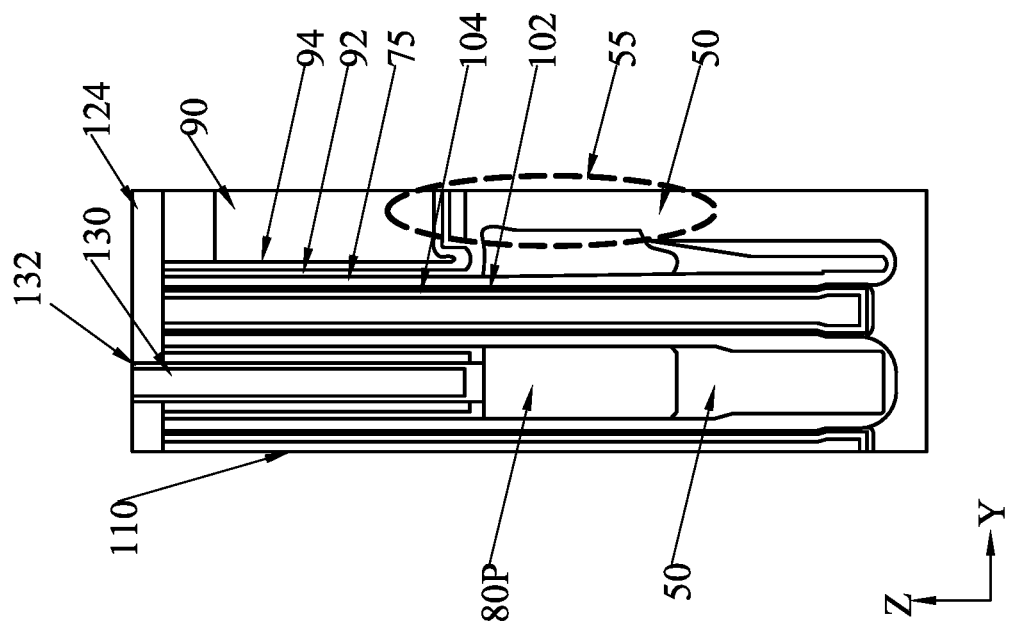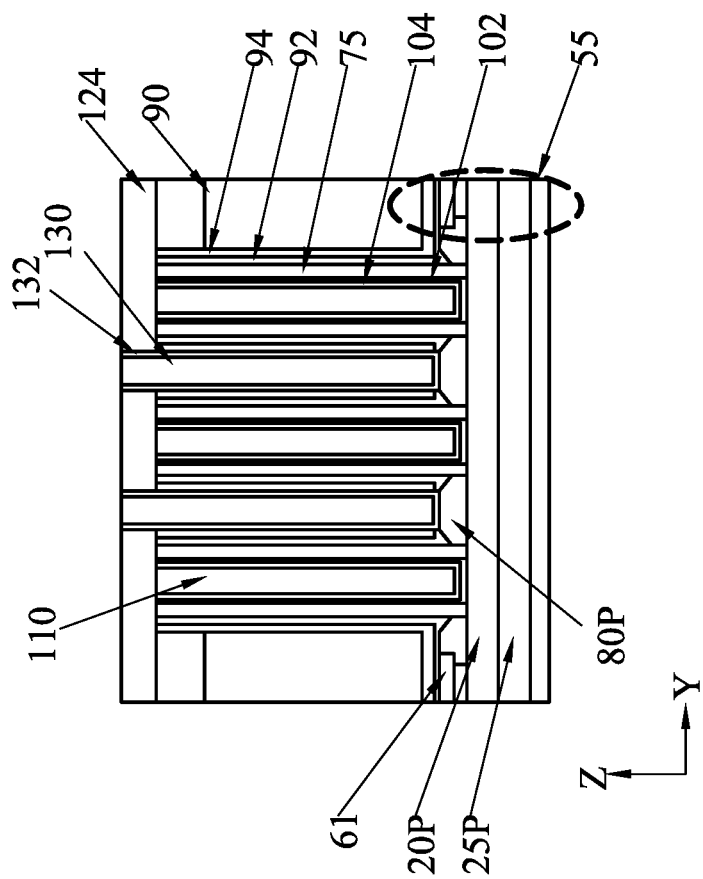
Fig.18C
Fig.18B

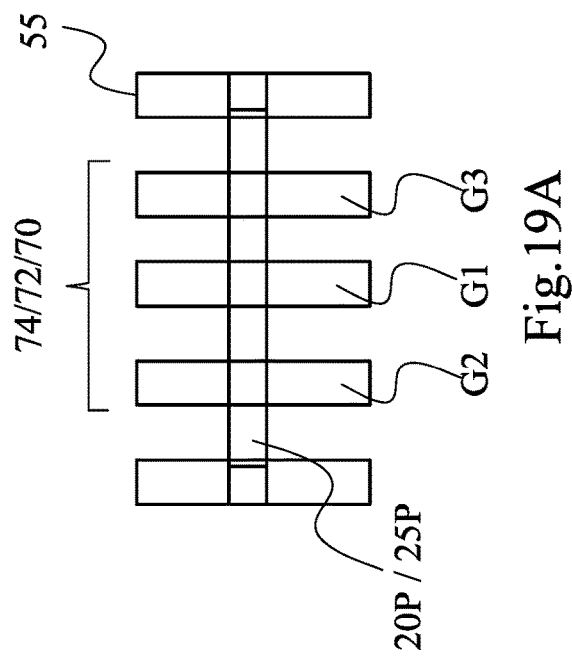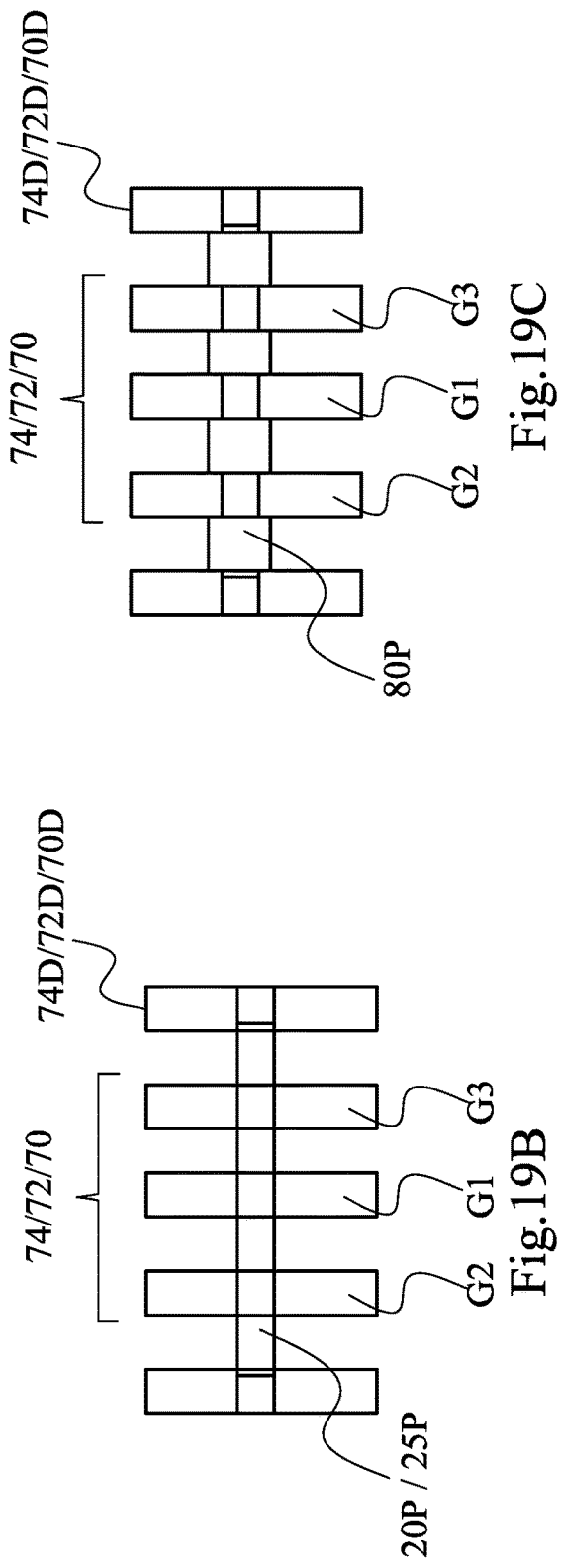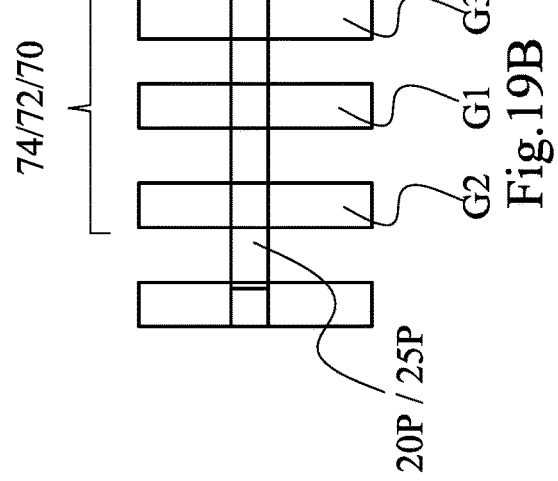

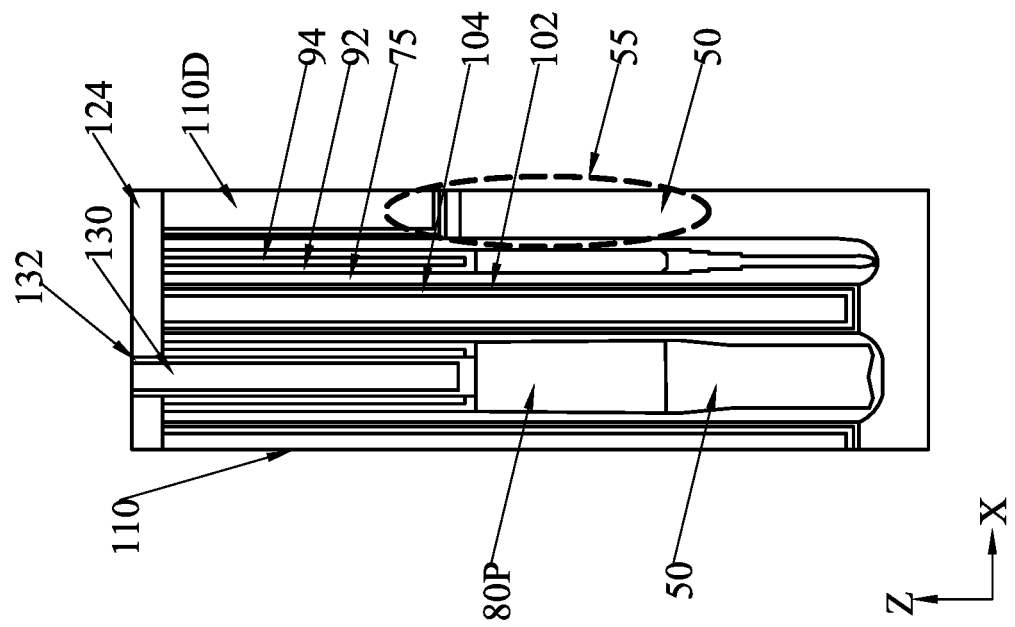
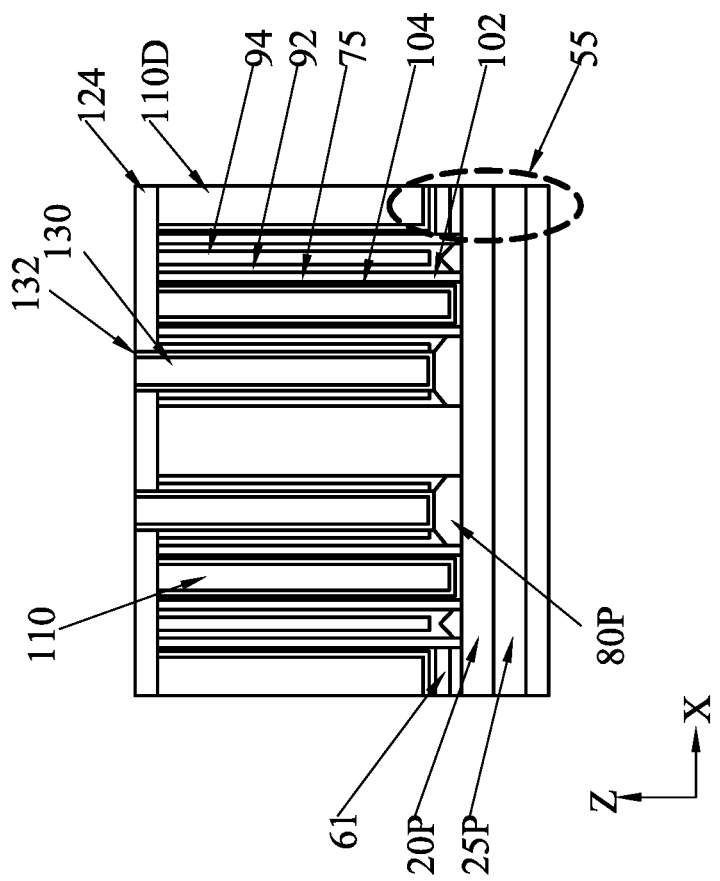
Fig.21C
Fig.21B

## SEMICONDUCTOR DEVICE AND MANUFACTURING METHOD THEREOF

CROSS-REFERENCE TO RELATED APPLICATIONS

This application is a Continuation application of U.S. Ser. No. 15/464,484, filed Mar. 21, 2017, which is a Continuation application of U.S. Ser. No. 15/157,139, filed May 17, 2016, now U.S. Pat. No. 9,627,540, which claims priority to U.S. Provisional Patent Application 62/261,289 filed Nov. 30, 2015, the entire disclosure of each is incorporated herein by reference.

TECHNICAL FIELD

The disclosure relates to a semiconductor integrated circuit, and more particularly to a semiconductor device having a gate-all-around structure and its manufacturing process.

BACKGROUND

As the semiconductor industry has progressed into nanometer technology process nodes in pursuit of higher device density, higher performance, and lower costs, challenges from both fabrication and design issues have resulted in the development of three-dimensional designs, such as a multi-gate field effect transistor (FET), including a fin FET (Fin FET) and a gate-all-around (GAA) FET. In a Fin FET, a gate electrode is adjacent to three side surfaces of a channel region with a gate dielectric layer interposed therebetween. Because the gate structure surrounds (wraps) the fin on three surfaces, the transistor essentially has three gates controlling the current through the fin or channel region. Unfortunately, the fourth side, the bottom part of the channel is far away from the gate electrode and thus is not under close gate control. In contrast, in a GAA FET, all side surfaces of the channel region are surrounded by the gate electrode, which allows for fuller depletion in the channel region and results in less short-channel effects due to steeper sub-threshold current swing (SS) and smaller drain induced barrier lowering (DIBL).

As transistor dimensions are continually scaled down to sub 10-15 nm technology nodes, further improvements of the GAA FET are required.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 3 shows one of the various stages of a sequential process for manufacturing the GAA FET device according to one embodiment of the present disclosure.

FIG. 4 shows one of the various stages of a sequential process for manufacturing the GAA FET device according to one embodiment of the present disclosure.

FIGS. 12A, 12B and 12C show one of the various stages of a sequential process for manufacturing the GAA FET device according to one embodiment of the present disclosure.

FIGS. 13A, 13B and 13C show one of the various stages of a sequential process for manufacturing the GAA FET device according to one embodiment of the present disclosure.

FIGS. 14A, 14B and 14C show one of the various stages of a sequential process for manufacturing the GAA FET device according to one embodiment of the present disclosure.

FIGS. 15A and 15B show one of the various stages of a sequential process for manufacturing the GAA FET device according to one embodiment of the present disclosure.

FIGS. 18A, 18B and 18C shows one of the various stages of a sequential process for manufacturing the GAA FET device according to one embodiment of the present disclosure.

FIGS. 19A, 19B and 19C show an exemplary structure of the GAA FET device according to another embodiment of the present disclosure.

FIGS. 21A, 21B and 21C show an exemplary structure of the GAA FET device according to another embodiment of the present disclosure.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

FIGS. 1-18C show exemplary sequential processes for manufacturing the GAA FET device according to one embodiment of the present disclosure. It is understood that additional operations can be provided before, during, and after processes shown by FIGS. 1-18C, and some of the operations described below can be replaced or eliminated, for additional embodiments of the method. The order of the operations/processes may be interchangeable.

Figure 1:
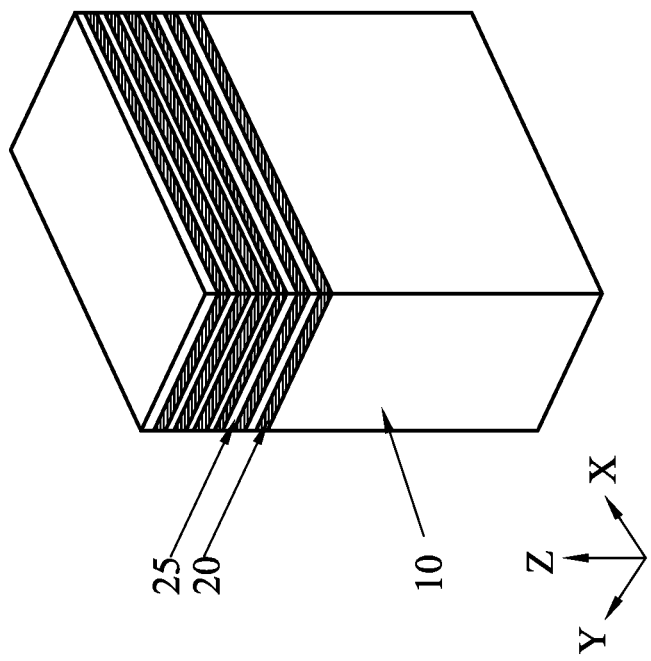
FIG. 1 shows one of the various stages of a sequential process for manufacturing the GAA FET device according to one embodiment of the present disclosure.

As shown in FIG. 1, stacked semiconductor layers are formed over a substrate 10. The stacked semiconductor layers include first semiconductor layers 20 and second semiconductor layers 25.

In one embodiment, substrate 10 includes a single crystalline semiconductor layer on at least it surface portion. The substrate 10 may comprise a single crystalline semiconductor material such as, but not limited to Si, Ge, SiGe, GaAs, InSb, GaP, GaSb, InAlAs, InGaAs, GaSbP, GaAsSb and InP. In this embodiment, the substrate 10 is made of Si.

The substrate 10 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In a particular embodiment, the substrate 10 comprises silicon germanium (SiGe) buffer layers epitaxially grown on the silicon substrate 10. The germanium concentration of the SiGe buffer layers may increase from 30 atomic % germanium for the bottom-most buffer layer to 70 atomic % germanium for the top-most buffer layer.

The first semiconductor layers 20 and the second semiconductor layers 25 are made of materials having different lattice constants, and may include one or more layers of such as, but not limited to Si, Ge, SiGe, GaAs, InSb, GaP, GaSb, InAlAs, InGaAs, GaSbP, GaAsSb and InP.

In some embodiments, the first semiconductor layers 20 and the second semiconductor layers 25 are made of Si, a Si compound, SiGe, Ge or a Ge compound. In one embodiment, the first semiconductor layers 20 are $Si_{1-x}Ge_x$, where x is more than about 0.3, or Ge (x=1.0) and the second semiconductor layers 25 are Si or $Si_{1-y}Ge_y$, where y is less than about 0.4, and x>y. In this disclosure, an "M" compound" or an "M based compound" means the majority of the compound is M.

In another embodiment, the second semiconductor layers 25 are $Si_{1-y}Ge_y$, where y is more than about 0.3, or Ge, and the first semiconductor layers 20 are Si or $Si_{1-x}Ge_x$, where x is less than about 0.4, and x<y. In yet other embodiments, the first semiconductor layer 20 is made of $Si_{1-x}Ge_x$, where x is in a range from about 0.3 to about 0.8, and the second semiconductor layer 25 is made of $Si_{1-x}Ge_x$, where x is in a range from about 0.1 to about 0.4, where the amount of Ge is different between the first semiconductor layer 20 and the second semiconductor layer 25.

In FIG. 1, six layers of the first semiconductor layer 20 and six layers of the second semiconductor layer 25 are disposed. However, the number of the layers are not limited to six, and may be as small as 1 (each layer) and in some embodiments, 2-10 layers of each of the first and second semiconductor layers are formed. By adjusting the numbers of the stacked layers, a driving current of the GAA FET device can be adjusted.

The first semiconductor layers 20 and the second semiconductor layers 25 are epitaxially formed over the substrate 10. The thickness of the first semiconductor layers 20 may be equal to or greater than that of the second semiconductor layers 25, and is in a range from about 5 nm to about 50 nm in some embodiments, and is in a range from about 10 nm to about 30 nm in other embodiments. The thickness of the second semiconductor layers 25 is in a range from about 5 nm to about 30 nm in some embodiments, and is in a range from about 10 nm to about 20 nm in other embodiments. The thickness of each of the first semiconductor layers 20 may be the same, or may vary. In certain embodiments, the thickness of the first semiconductor layers 20 is smaller than that of the second semiconductor layers 25.

In some embodiments, the bottom first semiconductor layer (the closest layer to the substrate 10) is thicker than the remaining first semiconductor layers. The thickness of the bottom first semiconductor layer is in a range from about 10 nm to about 50 nm in some embodiments, or is in a range from 20 nm to 40 nm in other embodiments.

Figure 2:
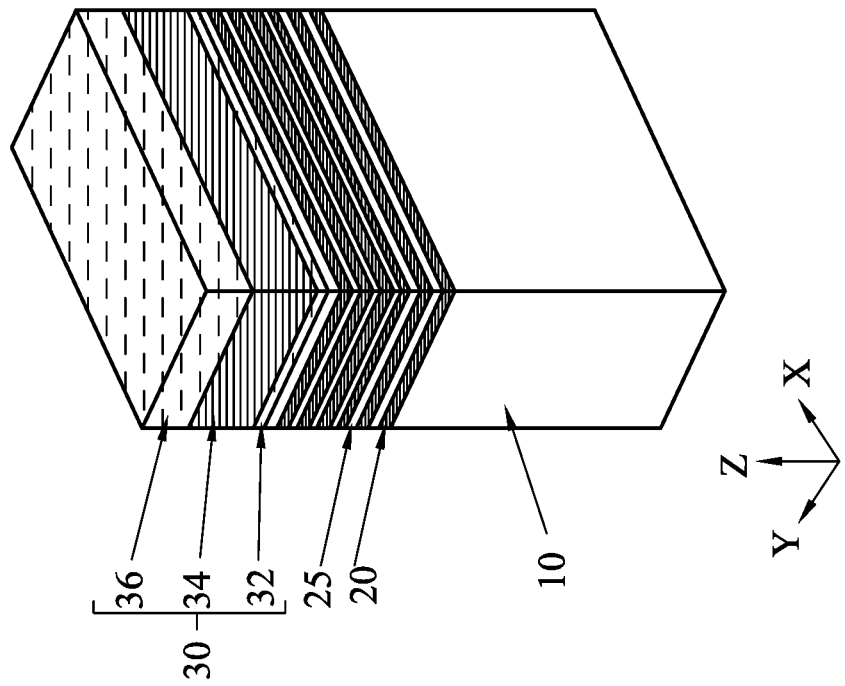
FIG. 2 shows one of the various stages of a sequential process for manufacturing the GAA FET device according to one embodiment of the present disclosure.

Next, as shown in FIG. 2 a mask layer 30 is formed over the stacked layers. In some embodiments, the mask layer 30 includes a first mask layer 32, a second mask layer 34 and a third mask layer 36. The first mask layer 32 is a pad oxide layer made of a silicon oxide, which can be formed by a thermal oxidation. The second mask layer 34 is made of a silicon nitride (SiN) and the third mask layer 36 is made of a silicon oxide, both of which are formed by chemical vapor deposition (CVD), including low pressure CVD (LPCVD) and plasma enhanced CVD (PECVD), physical vapor deposition (PVD), atomic layer deposition (ALD), or other suitable process. The mask layer 30 is patterned into a mask pattern by using patterning operations including photolithography and etching.

Next, as shown in FIG. 3, the stacked layers of the first and second semiconductor layers 20, 25 are patterned by using the patterned mask layer, thereby the stacked layers are formed into fin structures Fn and Fp extending in the Y direction. In the subsequent fabrication operations, the fin structure Fn is used to form an n-type FET and the fin structure Fp is used to formed a p-type FET. Each of the fin structures includes a bottom layer 15, which is a part of the etched substrate.

The width W1 of the fin structure along the X direction is in a range from about 5 nm to about 40 nm in some embodiments, and is in a range from about 6 nm to about 15 nm in other embodiments. The height H1 along the Z direction of the fin structure is in a range from about 30 nm to about 200 nm.

After the fin structure is formed, an isolation insulating layer 50 including one or more layers of insulating material is formed over the substrate so that the fin structures are fully embedded in the insulating layer 50. The insulating material for the insulating layer 50 may include silicon oxide, silicon nitride, silicon oxynitride (SiON), SiOCN, fluorine-doped silicate glass (FSG), or a low-K dielectric material, formed by LPCVD (low pressure chemical vapor deposition), plasma-CVD or flowable CVD. An anneal operation may be performed after the formation of the insulating layer 50. Then, a planarization operation, such as a chemical mechanical polishing (CMP) method and/or an etch-back method, is performed such that the upper surface of the pad oxide layer 32 is exposed from the insulating material layer as shown in FIG. 4. In some embodiments, the upper surface of the fin structures is exposed.

In some embodiments, a first liner layer 42 is formed over the structure of FIG. 3 and a second liner layer 44 is further formed over the first liner layer 42, as shown FIG. 4. The first liner layer 42 is made of silicon oxide or a silicon oxide-based material and the second liner layer 44 is made of SiN or a silicon nitride-based material. In other embodiments, the second liner layer 44 is made of silicon oxide or a silicon oxide-based material and the first liner layer 42 is made of SiN or a silicon nitride-based material.

Figure 5:
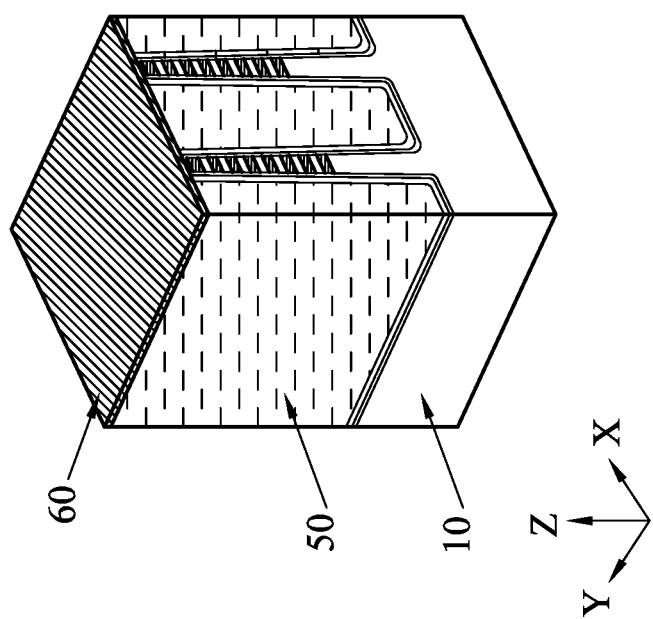
FIG. 5 shows one of the various stages of a sequential process for manufacturing the GAA FET device according to one embodiment of the present disclosure.

Then, as shown in FIG. 5, a mask layer 60 is formed over the structure of FIG. 4. The mask layer 60 is made of a silicon nitride-based material, such as SiN, SiON or SiCN, which has a higher selectivity against the insulating layer 50.

Figure 6:
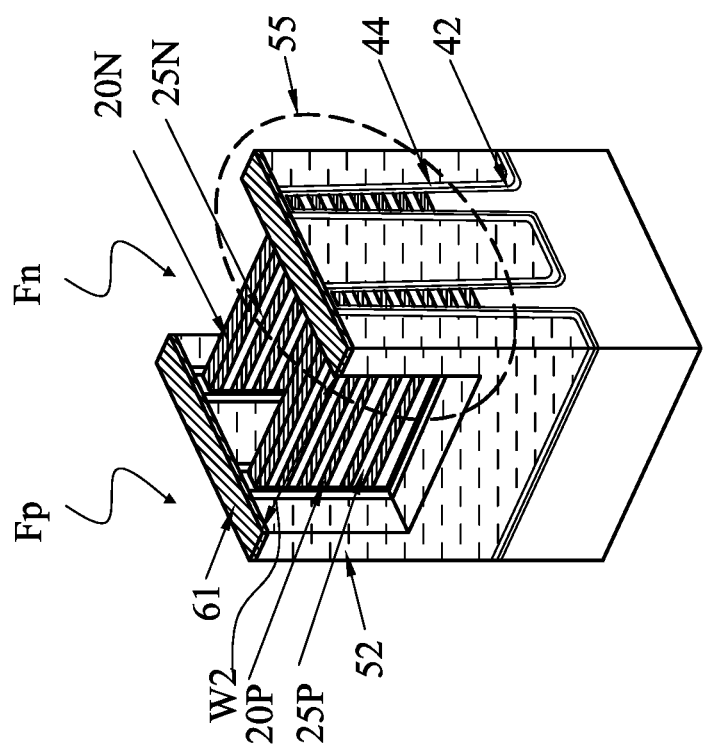
FIG. 6 shows one of the various stages of a sequential process for manufacturing the GAA FET device according to one embodiment of the present disclosure.

Subsequently, the mask layer 60 is patterned by using a lithography and an etching operation to make an opening and remaining boundary portions 61. Then, the insulating layer 50 is recessed, through the opening, to partially expose a part of the fin structures, as shown in FIG. 6. As shown in FIG. 6, end portions of the fin structures are buried in the isolation insulating layer, thereby forming an anchor structure 55. As shown in FIG. 6, the exposed fin structures Fp and Fn both include the stacked structure of the first semiconductor layer 20P and 20N and the second semiconductor layers 25P and 25N. In FIG. 5 and thereafter, the fin structures include seven first semiconductor layers and six second semiconductor layers.

As shown in FIG. 6, the bottom first semiconductor layer is partially exposed from the isolation insulating layer 50. In other embodiments, the bottom first semiconductor layer is fully embedded in the isolation insulating layer 50, or is fully exposed from the isolation insulating layer 50.

The width W2 between two anchor structures is in a range from about 40 nm to about 25 µm in some embodiments. The width W3 of the anchor structure 61 is in a range from about 15 nm to about 25 µm in some embodiments. The widths of two anchor structures may be the same or different from each other.

Figure 7:
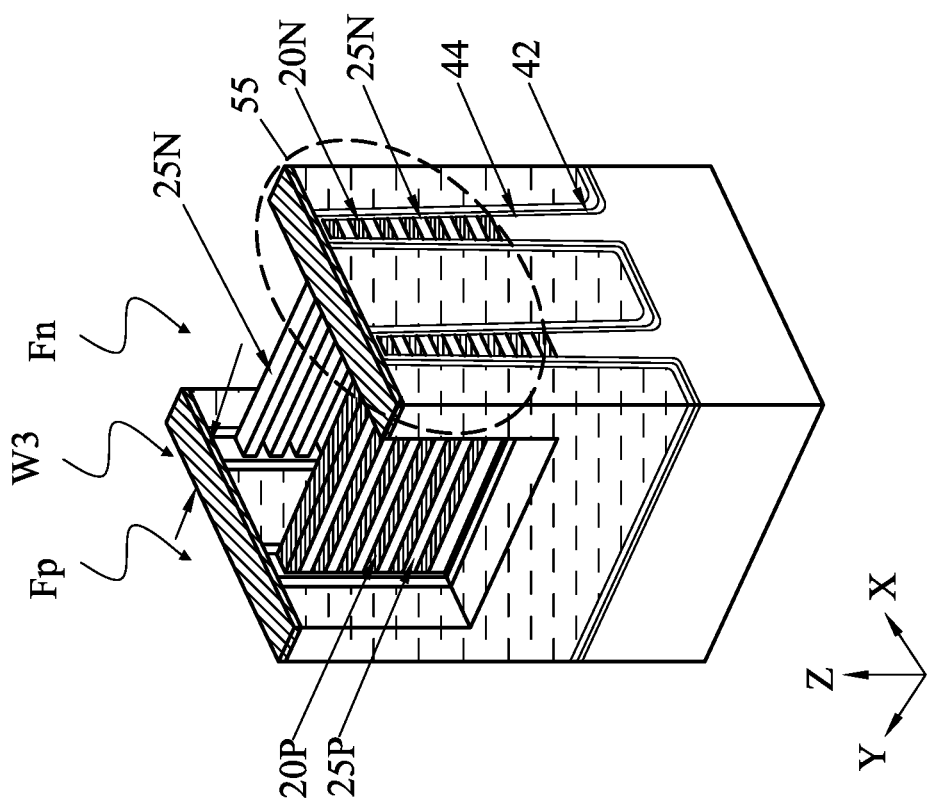
FIG. 7 shows one of the various stages of a sequential process for manufacturing the GAA FET device according to one embodiment of the present disclosure.

After the fin structures are exposed from the isolation insulating layer 50, the first semiconductor layers 20N in the fin structure Fn are removed, thereby forming wires of the second semiconductor layers 25N, as shown in FIG. 7. Since the anchor structures 55 are formed at the ends of the fin structure Fn the wires of the second semiconductor layers 25N can be supported by the anchor structures, and the first semiconductor layers 20N in the fin structure Fn can be removed in this stage of the manufacturing process.

Similarly, the second semiconductor layers 25P in the fin structure Fp are etched. Unlike the fin structure Fn, the second semiconductor layers 25P are partially removed in this embodiment. In certain embodiments, the second semiconductor layers 25P are fully removed from the fin structure Fp.

The first semiconductor layers 20N or the second semiconductor layers 25P can be removed or etched using an etchant that can selectively etch the first semiconductor layers 20N against the second semiconductor layers 25N or an etchant that can selectively etch the second semiconductor layers 25P against the first semiconductor layers 20P.

When the first semiconductor layers 20N are Ge or SiGe and the second semiconductor layers 25N are Si, the first semiconductor layers 20N can be selectively removed using a wet etchant such as, but not limited to ammonium hydroxide ($NH_4OH$), tetramethylammonium hydroxide (TMAH), ethylenediamine pyrocatechol (EDP), or potassium hydroxide (KOH) solution.

When the first semiconductor layers 20N are Si and the second semiconductor layers 25N are Ge or SiGe, the first semiconductor layers 20N can be selectively removed using a wet etchant such as, but not limited to ammonium hydroxide ($NH_4OH$), tetramethylammonium hydroxide (TMAH), ethylenediamine pyrocatechol (EDP), or potassium hydroxide (KOH) solution.

Similarly, for the fin structure Fp, when the second semiconductor layers 25P can be selectively etched by using an appropriate etchant. When the fin structure Fp is etched, the fin structure Fn is covered by a protective layer, such as a photoresist layer or a dielectric layer, and when the fin structure Fn is etched, the fin structure Fp is covered by a protective layer. The order of etching operations for the fin structures Fp and Fn can be interchangeable. The remaining boundary portions 61 may be removed at this stage.

Figure 8:
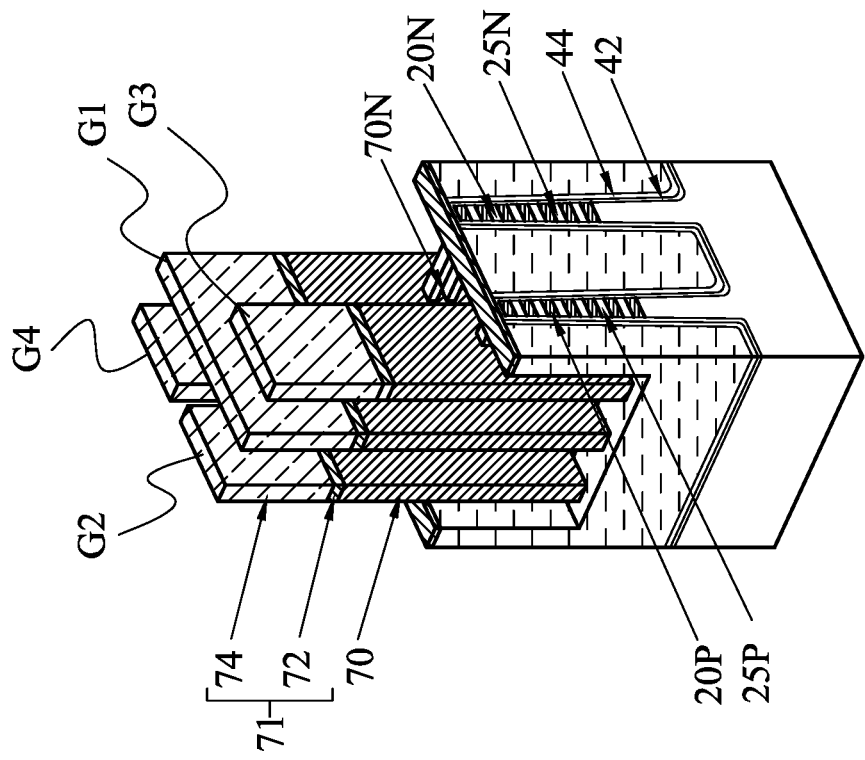
FIG. 8 shows one of the various stages of a sequential process for manufacturing the GAA FET device according to one embodiment of the present disclosure.

FIG. 8 illustrates a structure after a sacrificial gate structure is formed over the exposed fin structure (wires). The sacrificial gate structure includes a sacrificial gate electrode 70 and a sacrificial gate dielectric layer 70N. The sacrificial gate structure is formed over a portion of the fin structure which is to be a channel region. The sacrificial gate structure defines the channel region of the GAA FET.

The sacrificial gate structure 70 is formed by first blanket depositing a sacrificial gate dielectric layer over the fin structure (wires). The sacrificial gate dielectric layer includes one or more layers of silicon oxide, silicon nitride or silicon oxynitride. The thickness of the sacrificial gate dielectric layer is in a range from about 1 nm to about 5 nm in some embodiments. A sacrificial gate electrode layer is then blanket deposited on the sacrificial gate dielectric layer and over the fin structure (wires), such that the fin structure (wires) is fully embedded in the sacrificial gate electrode layer. The sacrificial gate electrode layer includes silicon such as poly crystalline silicon or amorphous silicon. The thickness of the sacrificial gate electrode layer is in a range from about 100 nm to about 200 nm in some embodiments. In some embodiments, the sacrificial gate electrode layer is subjected to a planarization operation. The sacrificial gate dielectric layer and the sacrificial gate electrode layer are deposited using CVD, including LPCVD and PECVD, PVD, ALD, or other suitable process.

Subsequently, a mask layer 71 is formed over the sacrificial gate electrode layer. The mask layer 71 includes a pad SiN layer 72 and a silicon oxide mask layer 74.

Next, a patterning operation is performed on the mask layer 71 and sacrificial gate electrode layer is patterned into the sacrificial gate structures G1-G4, as shown in FIG. 8. By patterning the sacrificial gate structure, the stacked layers of the first and second semiconductor layers are partially exposed on opposite sides of the sacrificial gate structure, as source/drain (S/D) regions. In this disclosure, a source and a drain are interchangeably used and the structures thereof are substantially the same. In some embodiments, an additional sacrificial gate structure (not shown), similar to G4, is disposed on the opposite side of G4 with respect to G1.

In one embodiment shown in FIG. 8, the sacrificial gate structure G1 is formed over the fin structures Fp and Fn, while the sacrificial gate structures G2 and G3 are formed over only the fin structure Fp and the sacrificial gate structure G4 is formed over only the fin structure Fn. The configuration of the sacrificial gate structures is not limited to that of FIG. 8.

Figure 9A:
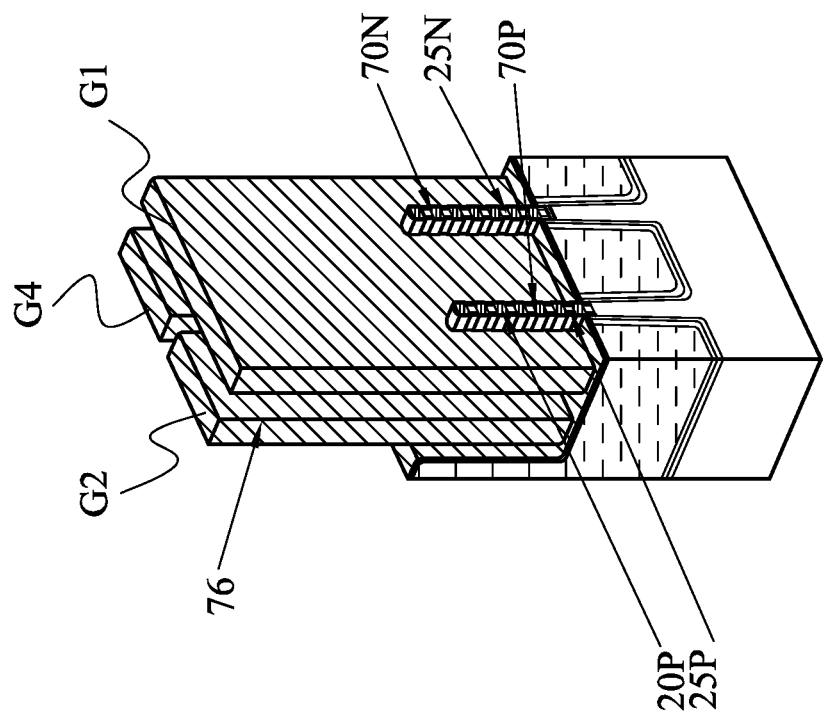
FIGS. 9A and 9B show one of the various stages of a sequential process for manufacturing the GAA FET device according to one embodiment of the present disclosure.
Figure 9B:
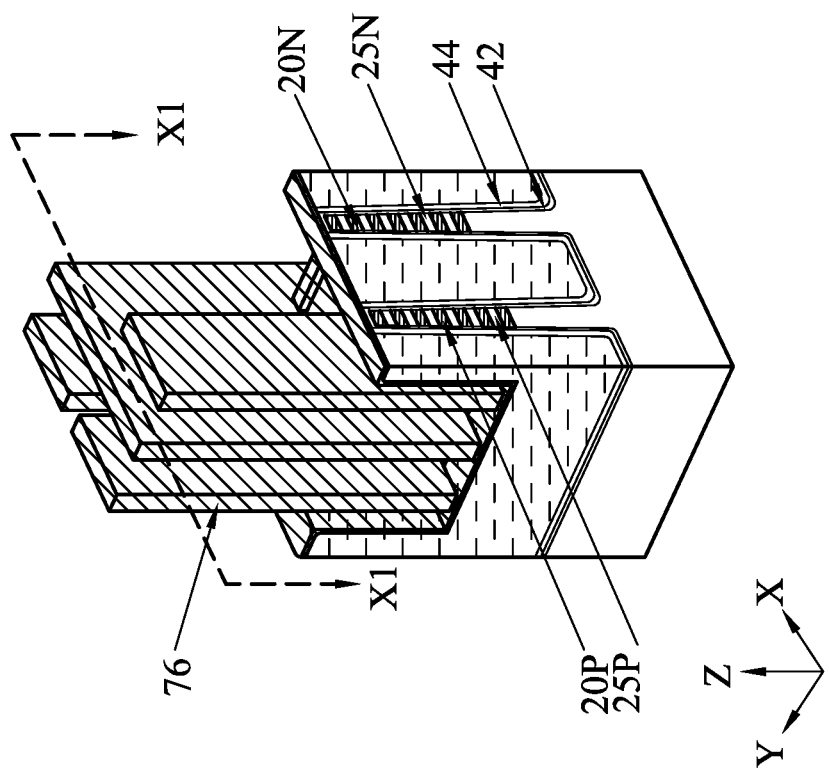

After the sacrificial gate structure is formed, a blanket layer 77 of an insulating material for sidewall spacers is conformally formed by using CVD or other suitable methods, as shown in FIGS. 9A and 9B. FIG. 9B is a cut view corresponding to line X1-X1 of FIG. 9A (between G1 and G3). The blanket layer 77 is deposited in a conformal manner so that it is formed to have substantially equal thicknesses on vertical surfaces, such as the sidewalls, horizontal surfaces, and the top of the sacrificial gate structure. In some embodiments, the blanket layer 77 is deposited to a thickness in a range from about 2 nm to about 10 nm. In one embodiment, the insulating material of the blanket layer 77 is a silicon nitride-based material, such as SiN, SiON, SiOCN or SiCN and combinations thereof.

As shown in FIG. 9B, in the fin structure Fn, the sacrificial gate dielectric layers 70N are interposed between the second semiconductor layers 25N, while the fin structure Fp includes the first semiconductor layer 20P and the partially etched second semiconductor layers 25N alternately stacked, and the sides of the second semiconductor layers 25N are covered by the sacrificial gate dielectric layers 70P.

Figure 10A:
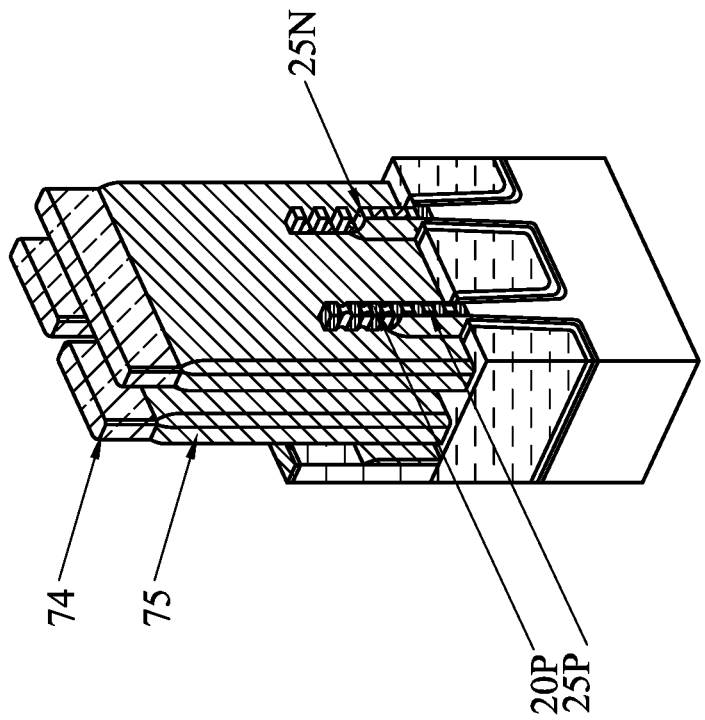
FIGS. 10A and 10B show one of the various stages of a sequential process for manufacturing the GAA FET device according to one embodiment of the present disclosure.
Figure 10B:
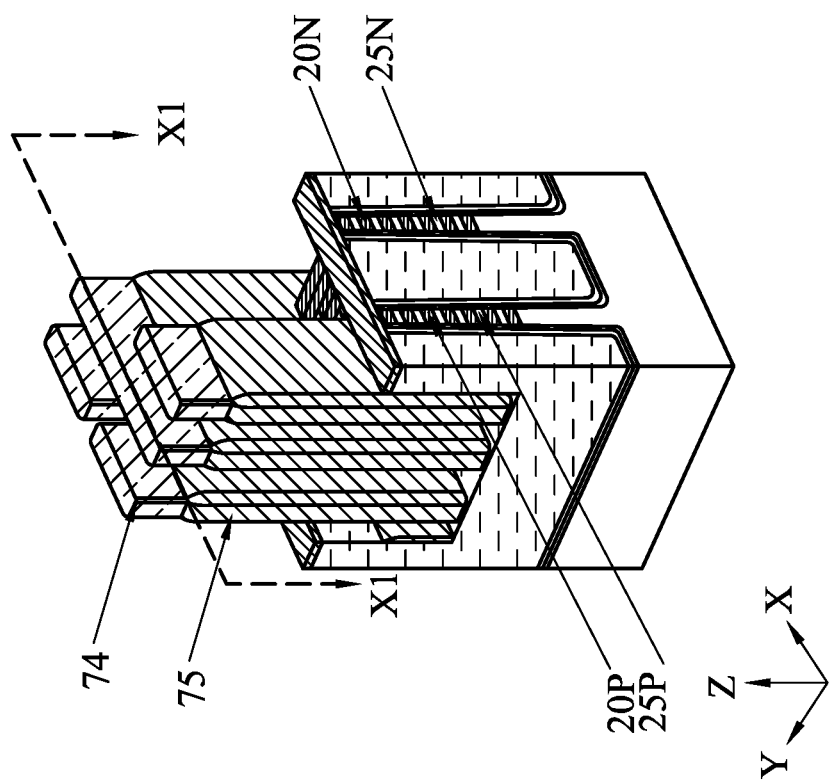

Further, as shown in FIGS. 10A and 10B, side wall spacers 76 are formed on opposite sidewalls of the sacrificial gate structures. FIG. 10B is a cut view corresponding to line X1-X1 of FIG. 10A (between G1 and G3).

After the blanket layer 77 is formed, anisotropic etching is performed on the blanket layer 77 using, for example, reactive ion etching (RIE). During the anisotropic etching process, most of the insulating material is removed from horizontal surfaces, leaving the dielectric spacer layer on the vertical surfaces such as the sidewalls of the sacrificial gate structures and the sidewalls of the exposed fin structures. The mask layer 74 may be exposed from the sidewall spacers. In some embodiments, isotropic etching is subsequently performed to remove the insulating material from the upper portions of the sidewalls of the exposed fin structures Fn and Fp, as shown in FIG. 10B. In other embodiments, the insulating material on the sidewalls of the fin structures is fully removed. In some embodiments, the isotropic etch is a wet etch process.

Figure 11B:
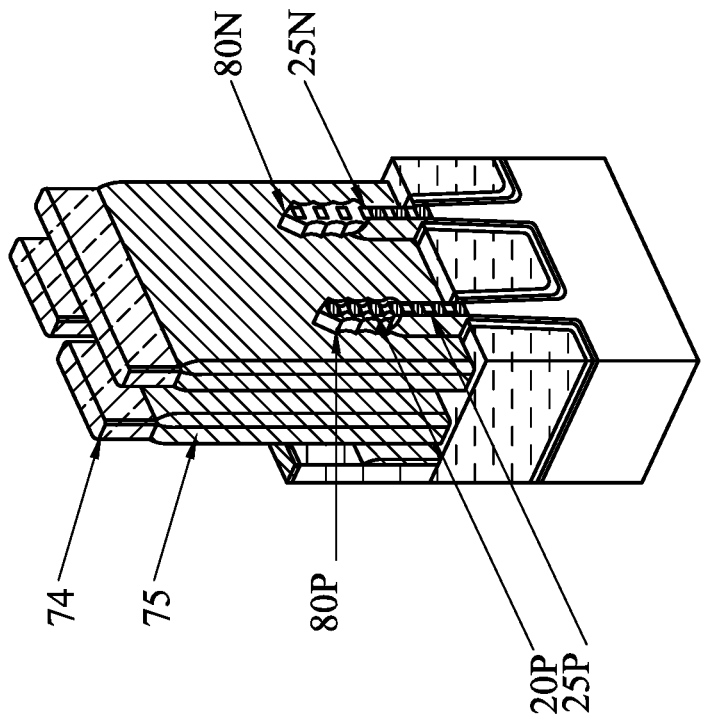
FIGS. 11A and 11B show one of the various stages of a sequential process for manufacturing the GAA FET device according to one embodiment of the present disclosure.
Figure 11A:
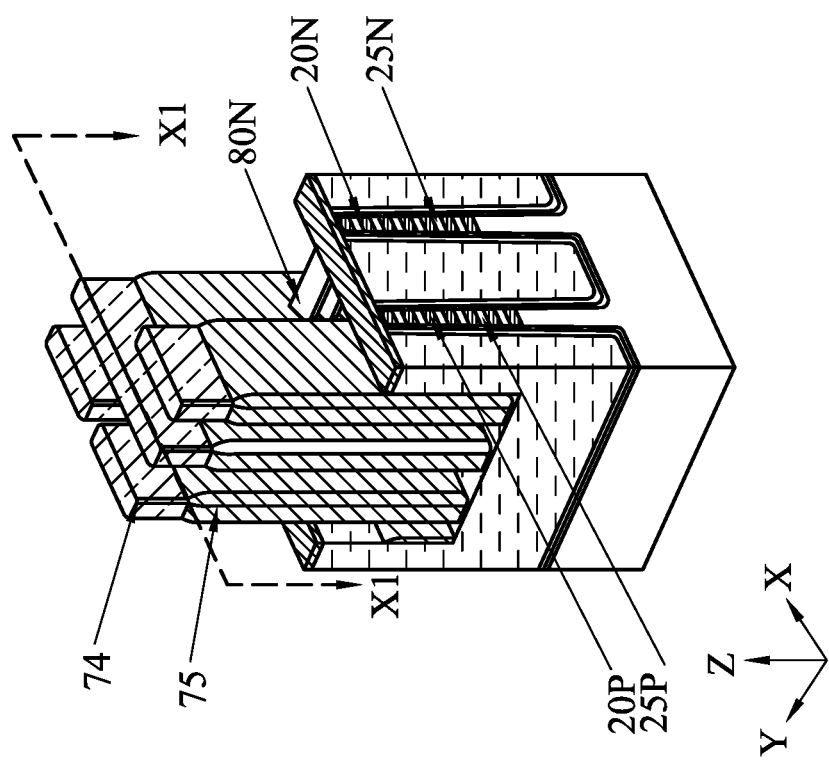

After at least the upper portions of the fin structures Fp and Fn are exposed from the sidewall spacers, source/drain (S/D) layers 80P for p-type FETs and a S/D layer 80N for an n-type FET are formed on and around the exposed portions of the fin structures Fp and Fn, as shown in FIGS. 11A and 11B. FIG. 11B is a cut view corresponding to line X1-X1 of FIG. 11A (between G1 and G3).

The material for the S/D layer 80P includes one or more layers of Ge or SiGe, where the Ge content is higher than the first semiconductor layer 20P. One or more layers of Group III-V compound semiconductors may be used for the S/D layer 80P. The material for the S/D layer 80N includes one or more layers of SiP or SiC.

The S/D layers 80P and 80N are formed by an epitaxial growth method using CVD, ALD or molecular beam epitaxy (MBE). When the S/D layer 80P is formed, the fin structure Fn is covered by a protective layer, such as SiN, and when the S/D layer 80N is formed, the fin structure Fp is covered by a protective layer.

FIGS. 12A-14C show enlarged views of the source/drain regions of the fin structure Fp.

In FIGS. 12A, 13A and 14A, the second semiconductor layers are fully removed at the manufacturing stage of FIG. 7. The S/D layer 80P is formed fully around the first semiconductor layers 20P, and the surface area of the S/D layer 80P can be maximized.

In FIGS. 12B, 13B and 14B, the second semiconductor layers 25P are partially etched at the manufacturing stage of FIG. 7. In this case, stress applied by the remaining second semiconductor layers 20P to the first semiconductor layers 25P is maintained, while a relatively larger surface area of the S/D layer 80P can be obtained. In FIGS. 12B, 13B and 14B, the second semiconductor layers 25P have a concave shape in the cross section. In other embodiments, the second semiconductor layers 25P have a rectangular shape in the cross section.

In FIGS. 12C, 13C and 14C, the second semiconductor layers 25P are not etched at the manufacturing stage of FIG. 7. In this case, stress applied by the remaining second semiconductor layers 20P to the first semiconductor layers 25P can be maximized.

After the S/D layers are formed, an interlayer dielectric layer (ILD) 90 is formed over the entire structures and then the upper portion of the interlayer dielectric layer 90 is planarized by a CMP operation so that the upper surface of the sacrificial gate electrode layers 70 are exposed, as shown in FIGS. 15A and 15B. FIG. 15B is a cut view corresponding to line X2-X2 of FIG. 15A.

The materials for the ILD layer 90 include compounds comprising Si, 0, C and/or H, such as SiCOH and SiOC. Organic material, such as polymers, may be used for the ILD layer 90. Further, in some embodiments, before forming the ILD layer 90, a silicon oxide layer 92 is formed over the structure of FIGS. 11A and 11B, and further a SiN layer 94 is formed over the oxide layer 92. A SiN layer 96 may also be formed over the ILD layer 90 to protect the ILD layer 90 from being etched during sacrificial gate oxide removal. The SiN layer 96 may not be necessary when the sacrificial gate oxide layer is thin.

Figure 16:
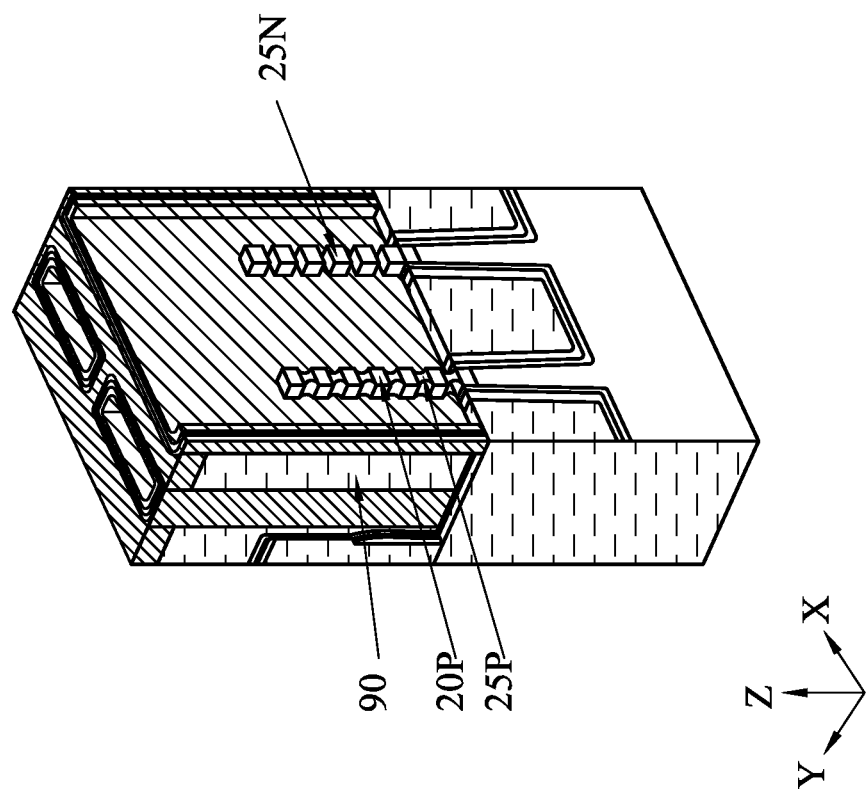
FIG. 16 shows one of the various stages of a sequential process for manufacturing the GAA FET device according to one embodiment of the present disclosure.

Subsequently, as shown in FIG. 16, the sacrificial gate electrodes 70 and sacrificial gate dielectric layers 75 are removed, thereby exposing the fin structures Fp and Fn, which subsequently become channel layers of the FETs. FIG. 16 is a cut view corresponding to line X1-X1 of FIG. 15A (between G1 and G3).

The ILD layer 50 protects the S/D structures 80P and 80N during the removal of the sacrificial gate structures. The sacrificial gate structures can be removed using plasma dry etching and/or wet etching. When the sacrificial gate electrode 70 is polysilicon and the ILD layer 90 is silicon oxide, a wet etchant such as a TMAH solution can be used to selectively remove the sacrificial gate electrodes 70. The sacrificial gate dielectric layer 75 is thereafter removed using plasma dry etching and/or wet etching. FIG. 16 shows the case where the sidewall spacers at the S/D region are fully removed.

Figure 17:
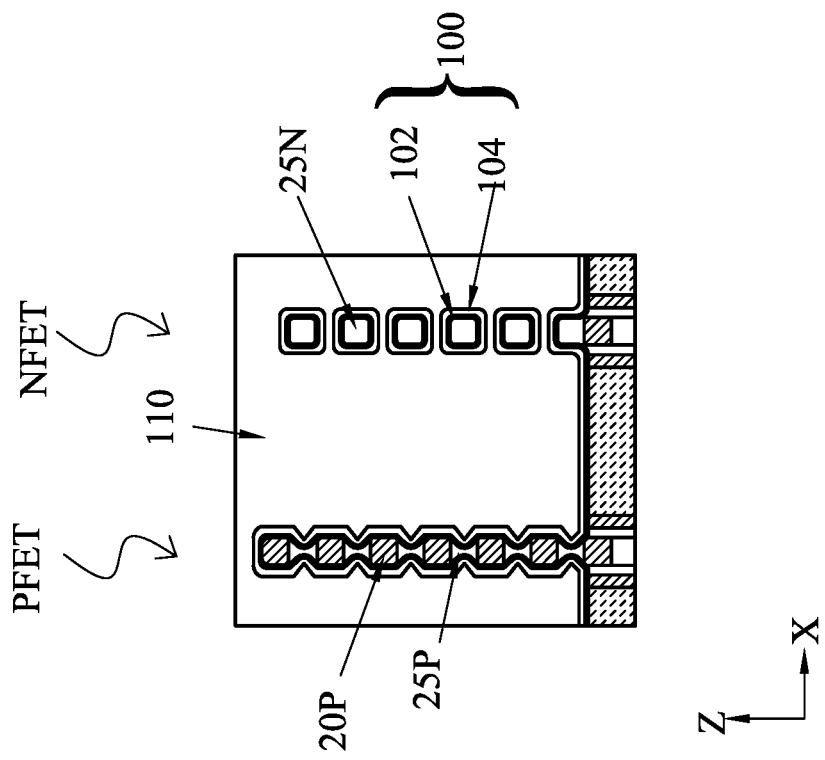
FIG. 17 shows one of the various stages of a sequential process for manufacturing the GAA FET device according to one embodiment of the present disclosure.

After the sacrificial gate structures are removed, a gate dielectric layer 100 is formed around each channel layers (20P, 20N, 25N), and a gate electrode layer 110 is formed on the gate dielectric layer 100, as shown in FIG. 17. In FIG. 17, the second semiconductor layers 25P have a concave shape in the cross section. In other embodiments, the second semiconductor layers 25P have a rectangular shape in the cross section.

In certain embodiments, the gate dielectric layer 100 includes one or more layers of a dielectric material 104, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric layer 100 includes an interfacial layer 102 formed between the channel layers and the dielectric material 104.

The gate dielectric layer 100 may be formed from CVD, ALD or any suitable method. In one embodiment, the gate dielectric layer 100 is formed using a highly conformal deposition process such as ALD in order to ensure the formation of a gate dielectric layer having a uniform thickness around each channel layers. The thickness of the gate dielectric layer 100 is in a range from about 1 nm to about 6 nm in one embodiment.

The gate electrode layer 110 is formed on the gate dielectric layer 100 to surround each channel layers. The gate electrode 110 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

The gate electrode layer 110 may be formed from CVD, ALD, electro-plating, or other suitable method. The gate electrode layer is also deposited over the upper surface of the ILD layer 90. The gate dielectric layer and the gate electrode layer formed over the ILD layer 90 is then planarized by using, for example, CMP, until the top surface of the ILD layer 90 is revealed. In some embodiments, the planarization operation is performed until the top surface of the SiN layer 96 is revealed, when the SiN layer 96 is used.

In certain embodiments of the present disclosure, one or more work function adjustment layers (not shown) are interposed between the gate dielectric layer 100 and the gate electrode 110. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process. Further, the work function adjustment layer may be formed separately for the n-channel FET and the p-channel FET which may use different metal layers.

Figure 18A:
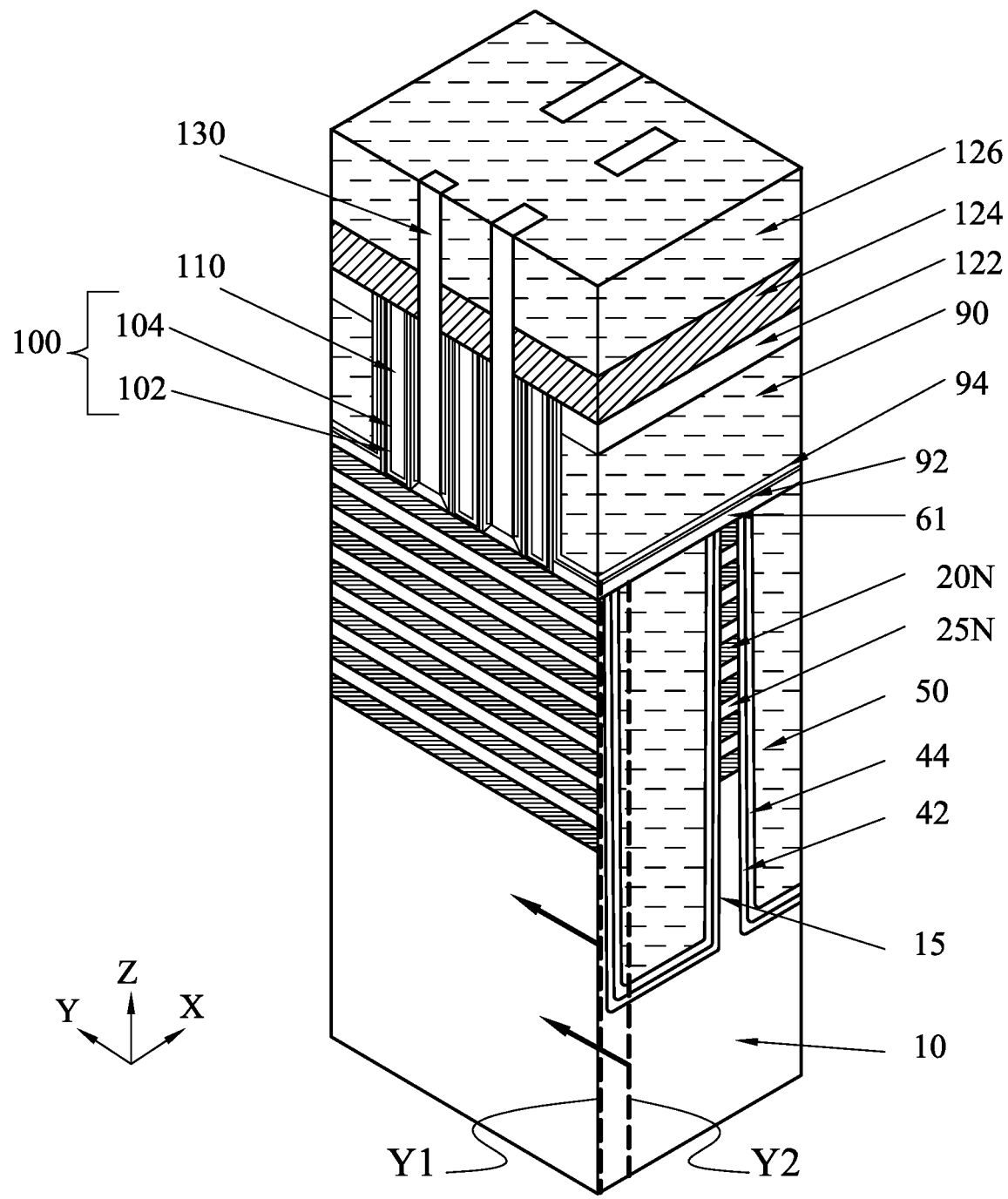

Subsequently, dielectric layers 122, 124 and 126 are further formed over the structure of FIG. 17, and contact layers 130 are formed as shown in FIGS. 18A-18C. FIG. 18B is a cross sectional view corresponding to line Y1 of FIG. 18A and FIG. 18C is a cross sectional view corresponding to line Y2 of FIG. 18A.

The dielectric layer 122 is made of the same material as the layer 96, SiN. The dielectric layer 124 is made of, for example, a silicon nitride based material or a silicon oxide based material. The dielectric layer 126 is made of, for example, a silicon oxide based material. The contact layer 130 includes one or more layers of metal material, such as Co, W, Ni, Al or Cu. In some embodiments, a barrier layer 132, such as a TiN or TaN layer, is formed before forming the contact layer 130.

In the structure of FIGS. 18A-18C, the anchor structure 55 is formed at ends of the fin structure or wires. In particular, in the n-type FET, the channel layers include semiconductor wires made of the second semiconductor layers 25N, and the semiconductor wires pass through the source/drain region and entered into the anchor structure. At the anchor structure, an end of the semiconductor wire has no gate electrode layer and no gate dielectric, and is sandwiched by the first semiconductor layers 20N. In the p-type FET, the channel layers include a fin structure of first semiconductor layers 20P and the partially etched second semiconductor layers 25P. At the anchor structure, the fin structure has first semiconductor layers 20P and the non-etched second semiconductor layers 25P, and has no gate electrode layer and no gate dielectric.

FIGS. 19A-19C show layout structures of the gate electrode. In FIG. 19A, three gate structures G1, G2 and G3 are disposed between two anchor structures 55 along the line Y3-Y3 of FIG. 20. In some embodiments, the gate structures G2 and G3 (also G4) are dummy gate structures to improve pattern fidelity in the gate patterning operations, and G1 is for an active gate.

Figure 20:
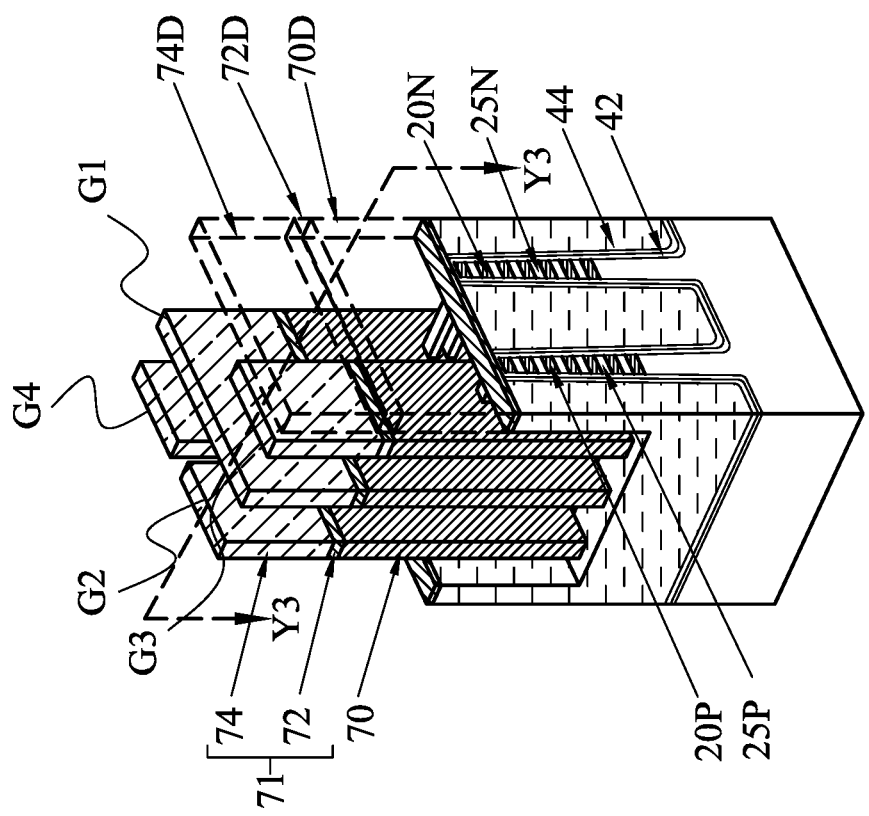
FIG. 20 shows an exemplary structure of the GAA FET device according to another embodiment of the present disclosure.

In FIG. 19B, additional sacrificial gate patterns 74D, 72D and 70D are formed over the anchor structures 55. FIG. 19C shows the structure after the S/D layer 80P is formed in the case of FIG. 19. In FIG. 20, only one of the additional sacrificial gate patterns is illustrated. The layer 70D, 72D and 74D correspond to the layers 70, 72 and 74 for the gate structures G1-G4. In this configuration, the pattern fidelity in the gate patterning operations can be further improved. It is noted that in some embodiments, an additional sacrificial gate structure (not shown), similar to G4, is disposed on the opposite side of G4 with respect to G1.

In the present embodiments, the anchor structures 55 (and the additional sacrificial gate patterns) are formed to sandwich the sacrificial gate structures G1-G3. This structure can increase the volume of the S/D layer (e.g., 80P) outside G2 and G3 for stress enhancement. If there are no anchor structures outside G2 and G3, the S/D layer would have facets that affect the size of the S/D layer and the S/D stressor performance would degrade.

Figure 21A:
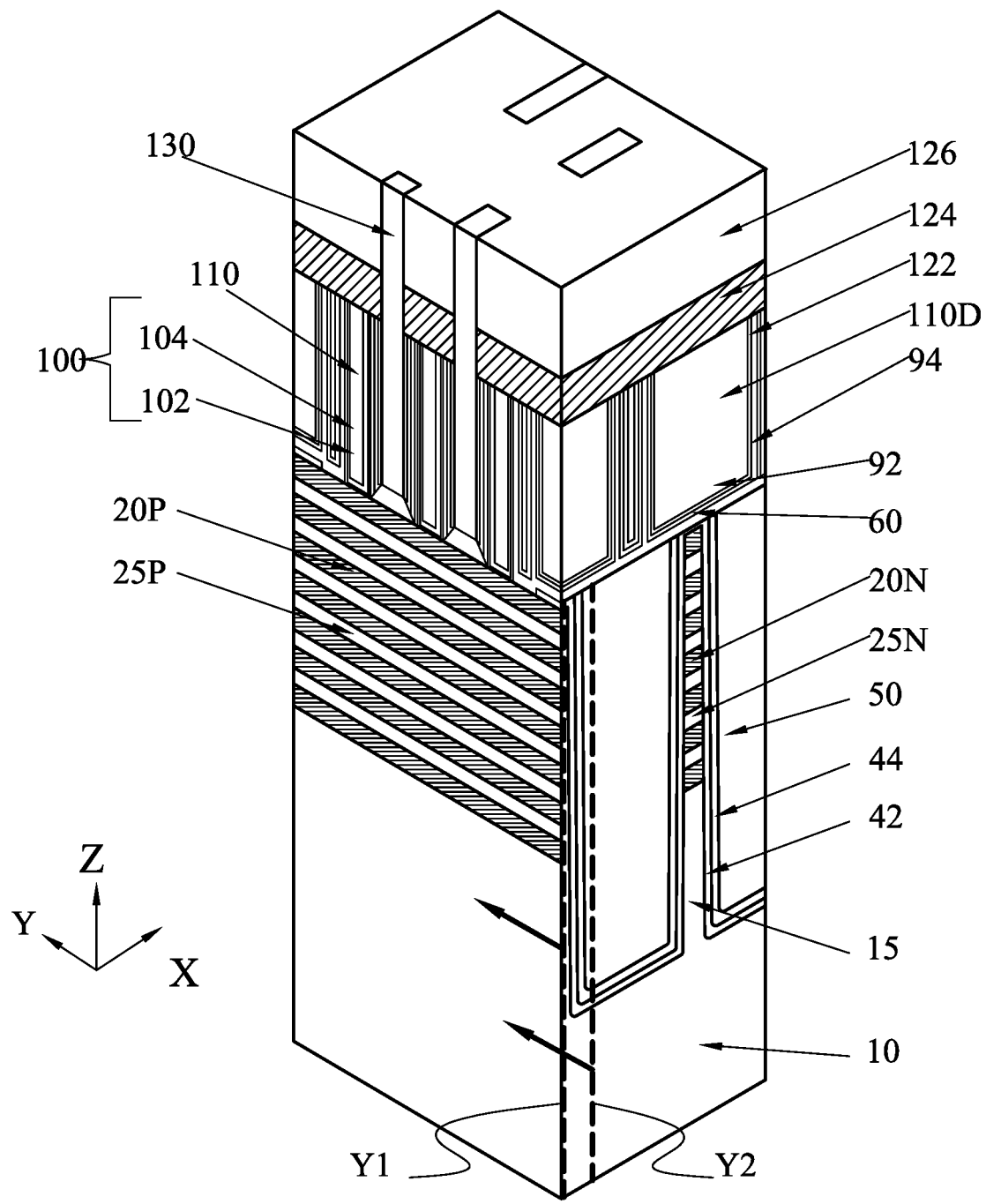

FIGS. 21A-21C show the structure when the additional sacrificial gate patterns 74D, 72D and 70D are formed over the anchor structures 55. In FIGS. 21A-21C, additional gate electrodes 110D are formed over the anchor structures 55.

It is understood that the GAA FETs undergo further CMOS processes to form various features such as contacts/vias, interconnect metal layers, dielectric layers, passivation layers, etc.

The various embodiments or examples described herein offer several advantages over the existing art. For example, in the present disclosure, by using the anchor structures, it is possible to make channel layers (e.g., wires) before forming source/drain layers. The anchor structure is formed by insulating material "walls" perpendicular to the channel layers. By using the anchor structures, dummy gates and an active gate form a self-assembled nested gate structure, which retains channel stress and enhances mobility for, in particular, p-channel gate all around transistors. Further, the GAA FET comprises stacked nanowires (Si and/or SiGe), in which manufacturing process, selective etching at a gate and a source/drain region is performed in the same process step.

In the GAA FET, a source/drain layer is fully or partially epitaxially grown on etched Si or SiGe stacked layers, which enhances surface area for contact landing.

It will be understood that not all advantages have been necessarily discussed herein, no particular advantage is required for all embodiments or examples, and other embodiments or examples may offer different advantages.

In accordance with one aspect of the present disclosure, in a method of manufacturing a semiconductor device, a stacked structure of first semiconductor layers and second semiconductor layers alternately stacked in a first direction is formed over a substrate. The stacked structure is patterned into a fin structure. An isolation insulating layer is formed over the fin structure. A cover layer is formed over the isolation insulating layer. The cover layer is patterned so as to make an opening and remaining boundary portions. The isolation insulating layer is recessed through the opening to partially expose the fin structure. End portions of the fin structures are buried in the isolation insulating layer. The second semiconductor layers in the partially exposed fin structure are removed, so that the first semiconductor layers are exposed. A sacrificial gate structure is formed over the exposed fin structure where the second semiconductor layers are removed, such that the sacrificial gate structure covers a part of the fin structure while remaining parts of the fin structure remain exposed. The remaining parts are source/drain regions and the part of the fin structure covered by the sacrificial gate structure is a channel region. Epitaxial source/drain structures are formed on the exposed first semiconductor layers in the source/drain regions so that the epitaxial source/drain structures wrap around each of the exposed first semiconductor layers in the source/drain regions. The sacrificial gate structure is removed to expose the channel region of the fin structure. A gate dielectric layer and a gate electrode layer are formed around the exposed first semiconductor layers in the channel region.

In accordance with another aspect of the present disclosure, in a method of manufacturing a semiconductor device, a stacked structure of first semiconductor layers and second semiconductor layers alternately stacked in a first direction is formed over a substrate. The stacked structure is patterned into a fin structure. An isolation insulating layer is formed over the fin structure. A cover layer is formed over the isolation insulating layer. The cover layer is patterned so as to form an opening and remaining boundary portions. The isolation insulating layer is recessed through the opening to partially expose the fin structure. End portions of the fin structures are buried in the isolation insulating layer. The second semiconductor layers in the partially exposed fin structure are partially removed. A sacrificial gate structure is formed over the exposed fin structure where the second semiconductor layers are partially removed, such that the sacrificial gate structure covers a part of the fin structure while remaining parts of the fin structure remain exposed. The remaining parts are source/drain regions and the part of the fin structure covered by the sacrificial gate structure is a channel region. Epitaxial source/drain structures are formed on the exposed fin structure in the source/drain regions. The sacrificial gate structure is removed to expose the channel region of the fin structure. A gate dielectric layer and a gate electrode layer are formed over the fin structure in the channel region.

In accordance with another aspect of the present disclosure, a semiconductor device includes first channel layers disposed over a substrate, a first source/drain region disposed over the substrate, a gate dielectric layer disposed on each of the first channel layers, a gate electrode layer disposed on the gate dielectric. Each of the first channel layers includes a semiconductor wire made of a first semiconductor material. The semiconductor wire passes through the first source/drain region and enters into an anchor region. At the anchor region, the semiconductor wire has no gate electrode layer and no gate dielectric, and is sandwiched by a second semiconductor material.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
   forming a fin structure in which first semiconductor layers and second semiconductor layers are alternately stacked in a first direction;
   forming an isolation insulating layer over the fin structure;
   forming anchor regions by patterning the isolation insulating layer, thereby partially exposing the fin structure, end portions of the fin structure being buried in the anchor regions;
   at least partially removing the second semiconductor layers in the partially exposed fin structure;
   forming dummy gate structures with sidewall spacers;
   partially removing the sidewall spacers from source/drain regions of the fin structure to partially expose the fin structure in the source/drain regions;
   forming epitaxial source/drain structures on the partially exposed fin structure in the source/drain regions; and
   forming a gate dielectric layer and a gate electrode layer around the exposed first semiconductor layers in a channel region,
   wherein, after the gate electrode layer is formed, a bottom of the source/drain regions of the fin structure are covered by the sidewall spacers.

2. The method of claim 1, wherein after the gate electrode layer is formed, the first semiconductor layers and the second semiconductor layers are alternately stacked at the anchor regions, and no gate electrode layer and no gate dielectric are included in the anchor regions.

3. The method of claim 2, wherein:
   the first semiconductor layers are made of Si, and
   the second semiconductor layers are made of SiGe.

4. The method of claim 2, wherein:
   the first semiconductor layers are made of SiGe, and
   the second semiconductor layers are made of Si.

5. The method of claim 2, wherein the epitaxial source/drain structures include at least one of SiP, SiCP and SiC.

6. The method of claim 2, wherein the epitaxial source/drain structures include SiGe.

7. The method of claim 1, wherein the second semiconductor layers are only partially removed in the partially exposed fin structure.

8. The method of claim 7, wherein the epitaxial source/drain structures cover the first semiconductor layers and the second semiconductor layers in the source/drain regions.

9. A semiconductor device, comprising:

first channel layers and a second channel layer disposed over a substrate;

a first source/drain region and a second source/drain region disposed over the substrate;

a first source/drain epitaxial layer covering an upper portion of the first source/drain region, and a second source/drain epitaxial layer covering an upper portion of the second source/drain region;

a first gate dielectric layer disposed on each of the first channel layers and a second gate dielectric layer disposed on the second channel layer;

a gate electrode layer disposed on the first gate dielectric layer and the second gate dielectric layer; and sidewall spacers disposed on opposing side faces of the gate electrode layer, wherein:

each of the first channel layers includes a semiconductor wire made of a first semiconductor material, the semiconductor wire passes through the first source/drain region and enters into an anchor region, and a bottom portion of the first source/drain region and a bottom portion of the second source/drain region are covered by an insulating layer made of a same material as the sidewall spacers.

10. The semiconductor device of claim 9, wherein at the anchor region, the semiconductor wire has no gate electrode layer and no gate dielectric layer, and is sandwiched by a second semiconductor material different from the first semiconductor material.

11. The semiconductor device of claim 10, wherein:
the first semiconductor material is made of SiGe, and
the second semiconductor material is Si.

12. The semiconductor device of claim 10, wherein:
the second channel layer includes a stacked structure of the first semiconductor material and the second semiconductor material.

13. The semiconductor device of claim 12, wherein:
the first semiconductor material is made of Si, and
the second semiconductor material is made of SiGe.

14. The semiconductor device of claim 10, wherein at the anchor region, the second channel layer has no gate electrode layer and no gate dielectric layer.

15. A semiconductor device, comprising:

a fin structure having a channel layer, source/drain regions and anchored regions;

source/drain epitaxial regions covering an upper portion of the source/drain regions;

a gate dielectric layer disposed on the channel layer;

a gate electrode layer disposed on the gate dielectric layer; and sidewall spacers disposed on opposing side faces of the gate electrode layer, wherein:

the anchored regions are embedded in anchor regions, the channel layer includes first semiconductor layers and second semiconductor layers alternately stacked in a vertical direction, widths of the first semiconductor layers in the channel layer are smaller than widths of the second semiconductor layers in the channel layer, the widths of the first semiconductor layers in the channel layer are smaller than widths of the first semiconductor layers in the anchor region, and a bottom portion of the source/drain region is covered by an insulating layer made of a same material as the sidewall spacers.

16. The semiconductor device of claim 15, wherein at the anchor region, the fin structure has no gate electrode layer and no gate dielectric layer.

17. The semiconductor device of claim 16, wherein:
the first semiconductor layers are made of SiGe, and
the second semiconductor layers are made of Si.

18. The semiconductor device of claim 17, wherein:
the first semiconductor layers are made of Si, and
the second semiconductor layers are made of SiGe.

19. The semiconductor device of claim 16, wherein the source/drain epitaxial regions include at least one of SiP, SiCP and SiC.

20. The semiconductor device of claim 16, wherein the source/drain epitaxial regions include SiGe.

* * * * *